US006483419B1

(12) United States Patent
Weaver et al.

(10) Patent No.: US 6,483,419 B1
(45) Date of Patent: Nov. 19, 2002

(54) COMBINATION HORIZONTAL AND VERTICAL THERMAL ACTUATOR

(75) Inventors: Billy L. Weaver, Eagan, MN (US); Douglas P. Goetz, St. Paul, MN (US); Kathy L. Hagen, Stillwater, MN (US); Mike E. Hamerly, Vadnais Heights, MN (US); Robert G. Smith, Vadnais Heights, MN (US); Silva K. Theiss, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 90 days.

(21) Appl. No.: 09/659,282

(22) Filed: Sep. 12, 2000

(51) Int. Cl.[7] .......................... H01H 37/52; H01H 37/46
(52) U.S. Cl. .......................... 337/393; 337/14; 337/16; 337/139; 60/528; 60/529; 310/307
(58) Field of Search .............................. 337/12, 14, 16, 337/139–141, 339, 343, 393, 298; 60/527–529; 310/306–309; 361/163

(56) References Cited

U.S. PATENT DOCUMENTS

| | | |
|---|---|---|
| 4,679,908 A | 7/1987 | Goodwin |
| 4,688,885 A | 8/1987 | Poteat et al. |
| 5,024,500 A | 6/1991 | Stanley et al. |
| 5,206,557 A | 4/1993 | Bobbio |
| 5,290,400 A | 3/1994 | Bobbio |
| 5,351,412 A | 10/1994 | Furuhata et al. |
| 5,401,983 A | 3/1995 | Jokerst et al. |
| 5,418,418 A | 5/1995 | Hirano et al. |
| 5,489,812 A | 2/1996 | Furuhata et al. |
| 5,506,175 A | 4/1996 | Zhang et al. |
| 5,536,988 A | 7/1996 | Zhang et al. |
| 5,602,955 A | 2/1997 | Haake |
| 5,685,062 A | 11/1997 | McCarthy et al. |
| 5,719,073 A | 2/1998 | Shaw et al. |
| 5,726,480 A * | 3/1998 | Pister .......................... 257/415 |

(List continued on next page.)

FOREIGN PATENT DOCUMENTS

| | | | |
|---|---|---|---|
| EP | 0 672 931 A1 | 9/1995 | |
| EP | 0 713 117 A1 | 5/1996 | |
| EP | 0 924 763 A2 | 6/1999 | |
| EP | 0 961 150 A2 | 12/1999 | |
| EP | 0 986 106 A1 | 3/2000 | |
| JP | 2001-138298 A * | 5/2002 | ............. B81B/3/00 |
| WO | 89/09477 | 10/1989 | |
| WO | 93/21663 | 10/1993 | |
| WO | 96/34417 | 10/1996 | |

OTHER PUBLICATIONS

See pp. 3–4 section entitled "Other Prior Art—Non Patent Documents".
Cowen et al., "Vertical Thermal Actuators for Micro–Opto–Electro–Mechanical Systems", 3226 SPIE, pp. 137–146 (1997).
Harsh et al., "The Realization and Design Considerations of a Flip–Chip Intergrated MEMS Tunabel Capacitor", 80 Sensors and Actuators, pp. 108–118 (2000).

(List continued on next page.)

*Primary Examiner*—Gerald Tolin
(74) *Attorney, Agent, or Firm*—Scott A. Bardell

(57) ABSTRACT

A micrometer sized, single-stage, horizontal and vertical thermal actuator capable of repeatable and rapid movement of a micrometer-sized optical device off the surface of a substrate. The horizontal and vertical thermal actuator is constructed on a surface of a substrate. At least one hot arm has a first end anchored to the surface and a free end located above the surface. A cold arm has a first end anchored to the surface and a free end. The cold arm is located above and laterally offset from the hot arm relative to the surface. The cold arm is adapted to provide controlled bending near the first end thereof. A member mechanically and electrically couples the free ends of the hot and cold arms such that the actuator exhibits horizontal and vertical displacement when current is applied to at least the hot arm.

37 Claims, 5 Drawing Sheets

U.S. PATENT DOCUMENTS

| | | | |
|---|---|---|---|
| 5,846,849 A | | 12/1998 | Shaw et al. |
| 5,847,454 A | | 12/1998 | Shaw et al. |
| 5,880,921 A | * | 3/1999 | Tham et al. ............... 333/262 |
| 5,912,094 A | | 6/1999 | Aksyuk et al. |
| 5,955,817 A | * | 9/1999 | Dhuler et al. ............... 310/307 |
| 5,959,376 A | | 9/1999 | Allen |
| 5,960,132 A | | 9/1999 | Lin |
| 5,962,949 A | * | 10/1999 | Dhuler et al. ............... 310/307 |
| 5,963,367 A | | 10/1999 | Aksyuk et al. |
| 5,994,159 A | | 11/1999 | Aksyuk et al. |
| 5,995,688 A | | 11/1999 | Aksyuk et al. |
| 6,014,240 A | | 1/2000 | Floyd et al. |
| 6,067,797 A | | 5/2000 | Silverbrook |
| 6,070,656 A | | 6/2000 | Dickey |
| 6,236,300 B1 | * | 5/2001 | Minners .................... 148/402 |
| 6,275,325 B1 | | 8/2001 | Sinclair |

OTHER PUBLICATIONS

Harsh et al., "Flip–Chip Assembly for SI–Based RF MEMS", IEEE Conference on Micromechanical Systems, 35 pp. 273–278 (1999).

Feng et al., "MEMS–Based Variable Capacitor for Millimeter–Wave Applications", Soild State Sensor and Actuator Workshop, pp. 255–258 (2000).

Noworolski et al., "Process for In–Plane and Out–of–Plane Single–Crystal–Silicon Thermal Microactuators", 55 Sensors and Actuators, pp. 65–69 (1996).

Riethmuller et al., "Thermally Excited Silicon Microactuators", 3 IEEE Transactions on Electron Devices, pp. 758–763 (1988).

Thielicle et al., "Microactuators and Their Technologies", 10 Mechatronics, pp. 431–455 (2000).

Burns et al., Design and Performance of a Double Hot Arm Polysilicon Thermal Actuator, 3224 SPIE, pp. 296–306 (1997).

Read et al., "Mechanical and Optical Characterization of Thermal Microactuators Fabricated in a CMOS Process", 2642 SPIE, pp. 22–32 (1995).

Comtois et al., "Thermal Microactuators for Surface–Micromaching Processes", 2642 SPIE, pp. 10–21 (1995).

Comtois et al., "Characterization of Electrothermal Actuators and Arrays fabricated in a Four–level, Planarized Surface–Micromachined and Polycrystalline Silicon Process", Intl' Conf. On Solid–State Sensors and Actuators, pp. 679–772 (1997).

Reid et al., "Automated Assembly of Flip–Up Micromirrors". 66 Sensors and Actuators, pp. 292–298 (1998).

Toshiyoshi et al., "Electromagnetic Torsion Mirrors for Self–Aligned Fiber–optic Crossconnectors by Micromachining", 5 IEEE Journal of Selected Topics in Quantum Mechanics, pp. 10–17 (1999).

Thielicke et al., "Microactuators and their Technologies", 10 Mechatronics, pp. 431–455 (2000).

Chiou et al., "A Micromirror Device with Tilt and Piston Motions", 3893 SPIE, pp. 298–303 (1999).

Aksyuk et al., "Stress–Induced Curvature Engineering in Surface–Micromachined Devices", 3680 SPIE, pp. 984–993 (1999).

Koester et al., "MUMPs™ Design Handbook", Revision 5.0 Cronos Integrated Microsystems, pp. 1–38 (2000).

* cited by examiner

COMBINATION HORIZONTAL AND VERTICAL THERMAL ACTUATOR

FIELD OF THE INVENTION

The present invention relates generally to micromechanical devices, and more particularly, to a micrometer sized horizontal and vertical thermal actuator that is capable of repeatable and rapid movement of a micrometer-sized device off the surface of the substrate.

BACKGROUND OF THE INVENTION

Fabricating complex micro-electro-mechanical systems (MEMS) and micro-optical-electro-mechanical systems (MOEMS) devices represents a significant advance in micro-mechanical device technology. Presently, micrometer-sized analogs of many macro-scale devices have been made, such as for example hinges, shutters, lenses, mirrors, switches, polarizing devices, and actuators. These devices can be fabricated, for example, using Multi-user MEMS processing (MUWs) available from Cronos Integrated Microsystems located at Research Triangle Park, N.C. Applications of MEMS and MOEMS devices include, for example, data storage devices, laser scanners, printer heads, magnetic heads, micro-spectrometers, accelerometers, scanning-probe microscopes, near-field optical microscopes, optical scanners, optical modulators, micro-lenses, optical switches, and micro-robotics.

One method of forming a MEMS or MOEMS device involves patterning the device in appropriate locations on a substrate. As patterned, the device lies flat on top of the substrate. For example, the hinge plates of a hinge structure or a reflector device are both formed generally coplanar with the surface of the substrate using the MUMPs process. One challenge to making use of these devices is moving them out of the plane of the substrate.

Coupling actuators with micro-mechanical devices allows for moving these devices out of the plane of the substrate. Various types of actuators, including electrostatic, piezoelectric, thermal and magnetic have been used for this purpose.

One such actuator is described by Cowan et al. in "Vertical Thermal Actuator for Micro-Opto-Electro-Mechanical Systems", v.3226, SPIE, pp. 137–46 (1997). The actuator 20 of Cowan et al. illustrated in FIG. 1 uses resistive heating to induce thermal expansion. The hot arm 22 is higher than the cantilever arm 24, so that thermal expansion drives the actuator tip 26 toward the surface of the substrate 28. At sufficiently high current, the downward deflection of the actuator tip 26 is stopped by contact with the substrate 28 and the hot arms 22 bow upward. Upon removal of the drive current the hot arms 22 rapidly "freeze" in the bowed shape and shrink, pulling the actuator tip 26 upward, as illustrated in FIG. 2.

The deformation of the hot arm 22 is permanent and the actuator tip 26 remains deflected upward without applied power, forming a backbent actuator 32. Further application of the drive current causes the backbent actuator 32 to rotate in the direction 30 toward the surface of the substrate 28. The backbent actuator 32 of FIG. 2 is typically used for setup or one-time positioning applications. The actuators described in Cowan et al. are limited in that they cannot rotate or lift hinged plates substantially more than forty-five degrees out-of-plane in a single actuation step.

Harsh et al., "Flip Chip Assembly for Si-Based Rf MEMS" Technical Digest of the Twelfth IEEE International Conference on Micro Electro Mechanical Systems, IEEE Microwave Theory and Techniques Society 1999, at 273–278; Harsh et al., "The Realization and Design Considerations of a Flip-Chip Integrated MEMS Tunable Capacitor" 80 Sensors and Actuators 108–118 (2000); and Feng et al., "MEMS-Based Variable Capacitor, for Millimeter-Wave Applications" Solid-State Sensor and Actuator Workshop, Hilton Head Island, S.C. 2000, at 255–258 disclose various vertical actuators based upon a flip-chip design. During the normal release etching step, the base oxide layer is partially dissolved and the remaining MEMS components are released. A ceramic substrate is then bonded to the exposed surface of the MEMS device and the base polysilicon layer is removed by completing the etch of the base oxide layer (i.e., a flip chip process). The resultant device, which is completely free of the polysilicon substrate, is a capacitor in which the top plate of the capacitor is controllably moved in a downward fashion toward an opposing plate on the ceramic substrate. The device is removed from the polysilicon substrate because stray capacitance effects of a polysilicon layer would at a minimum interfere with the operation of the device.

Lift angles substantially greater than forty-five degrees are achievable with a dual-stage actuator system. A dual-stage actuator system typically consists of a vertical actuator and a motor. The vertical actuator lifts the hinged micro-mechanical device off of the substrate to a maximum angle not substantially greater than forty-five degrees. The motor, which has a drive arm connected to a lift arm of the micro-mechanical device, completes the lift. One such dual-stage assembly system is disclosed by Reid et al. in "Automated Assembly of Flip-Up Micromirrors", Transducers '97, Int'l Conf. Solid-State Sensors and Actuators, pp. 347–50 (1997). These dual stage actuators are typically used for setup or one-time positioning applications.

The dual-stage actuator systems are complex, decreasing reliability and increasing the cost of chips containing MEMS and MOEMS devices. As such, there is a need for a micrometer sized horizontal and vertical thermal actuator that is capable of repeatable and rapid movement of a micrometer-sized device off the surface of the substrate.

BRIEF SUMMARY OF THE INVENTION

The present invention is direct to a micrometer sized horizontal and vertical thermal actuator capable of repeatable and rapid movement of a micrometer-sized optical device off the surface of the substrate.

The horizontal and vertical thermal actuator is constructed on a surface of a substrate. At least one hot arm has a first end anchored to the surface and a free end located above the surface. A cold arm has a first end anchored to the surface and a free end. The cold arm is located above and laterally offset from the hot arm relative to the surface. A member mechanically and electrically couples the free ends of the hot and cold arms such that the actuator exhibits vertical displacement and horizontal displacement when current is applied to at least the hot arm.

The flexure comprises at least one of a recess, depression, cut-out, hole, location of narrowed, thinned or weakened material, alternate material or other structural features or material change that decreases resistance to bending in that location. In one embodiment, the hot arm and the cold arm comprise a circuit through which electric current is passed. In another embodiment, a grounding tab electrically couples the hot arm to the substrate. In the embodiment with the grounding tab, the cold arm can optionally be electrically isolated from the hot arm.

In one embodiment, a reinforcing member is formed in the cold arm. The reinforcing member typically extends from proximate the flexure to proximate the free end thereof. The reinforcing member can be integrally formed in the cold arm. In one embodiment, the reinforcing member extends longitudinally along the cold arm, such as one or more ridges extending longitudinally along the cold arm.

In one embodiment, the least one hot arm comprises two or more hot arms each having a first end anchored to the surface and free ends located above the surface. The plurality of hot arms can optionally be arranged laterally offset and symmetrical with the cold arm.

In another embodiment, the horizontal and vertical thermal actuator constructed on a surface includes a first beam having a first end anchored to the surface and a free end located above the surface. A second beam has a first end anchored to the surface and a free end located above the surface. A member electrically and mechanically couples the free end of the first beam to the free end of the second beam. A third beam has a first end anchored to the surface and a free end mechanically coupled to the member. The third beam is located above and laterally offset from the first and second beams relative to the surface. First and second electrical contacts are electrically coupled to the first ends of the first and second beams, respectively. The actuator exhibits vertical displacement and horizontal displacement when current is applied to the first and second beams.

A plurality of horizontal and vertical thermal actuators can be formed on a single substrate. At least one optical device can be mechanically coupled to the horizontal and vertical thermal actuator. The optical device comprises one of a reflector, a lens, a polarizer, a wave-guide, a shutter, or an occluding structure. The optical device can be part of an optical communication system.

BRIEF DESCRIPTION OF THE SEVERAL VIEWS OF THE DRAWING

Further features of the invention will become more apparent from the following detailed description of specific embodiments thereof when read in conjunction with the accompany drawings.

DETAILED DESCRIPTION OF THE INVENTION

The present invention relates to a horizontal and vertical thermal actuator for micro-mechanical devices. The micrometer sized horizontal and vertical thermal actuator is capable of repeatable and rapid movement out of plane.

As used herein, "micro-mechanical device" refers to micrometer-sized mechanical, opto-mechanical, electro-mechanical, or opto-electro-mechanical device. Various technology for fabricating micro-mechanical devices is available using the Multi-User MEMS Processes (MUMPs) from Cronos Integrated Microsystems located at Research Triangle Park, N.C. One description of the assembly procedure is described in "MUMPs Design Handbook", revision 5.0 (2000) available from Cronos Integrated Microsystems.

Polysilicon surface micromachining adapts planar fabrication process steps known to the integrated circuit (IC) industry to manufacture micro-electro-mechanical or micromechanical devices. The standard building-block processes for polysilicon surface micromachining are deposition and photolithographic patterning of alternate layers of low-stress polycrystalline silicon (also referred to as polysilicon) and a sacrificial material (e.g., silicon dioxide or a silicate glass). Vias etched through the sacrificial layers at predetermined locations provide anchor points to a substrate and mechanical and electrical interconnections between the polysilicon layers. Functional elements of the device are built up layer by layer using a series of deposition and patterning process steps. After the device structure is completed, it can be released for movement by removing the sacrificial material using a selective etchant such as hydrofluoric acid (HF) which does not substantially attack the polysilicon layers.

The result is a construction system generally consisting of a first layer of polysilicon which provides electrical interconnections and/or a voltage reference plane, and additional layers of mechanical polysilicon which can be used to form functional elements ranging from simple cantilevered beams to complex electromechanical systems. The entire structure is located in-plane with the substrate. As used herein, the term "in-plane" refers to a configuration generally parallel to the surface of the substrate and the terms "out-of-plane" refer to a configuration greater than zero degrees to about ninety degrees relative to the surface of the substrate.

Typical in-plane lateral dimensions of the functional elements can range from one micrometer to several hundred micrometers, while the layer thicknesses are typically about 1–2 micrometers. Because the entire process is based on standard IC fabrication technology, a large number of fully assembled devices can be batch-fabricated on a silicon substrate without any need for piece-part assembly.

Figure 1:
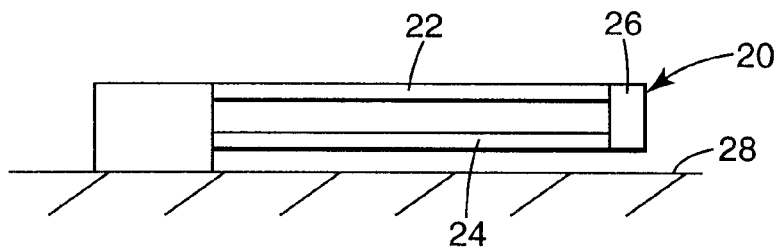
FIG. 1 is a side view of a vertical thermal actuator prior to backbending.
Figure 2:
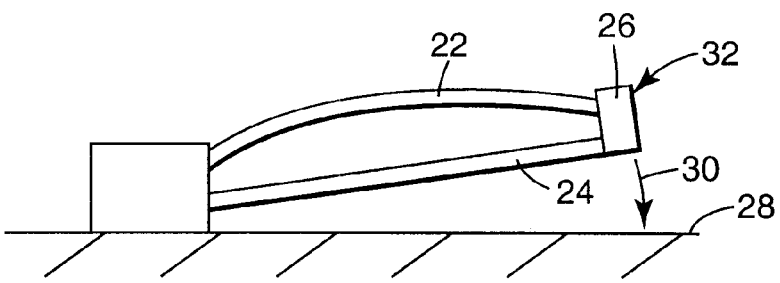
FIG. 2 is a side view of the vertical thermal actuator of FIG. 1 after backbending.
Figure 3:
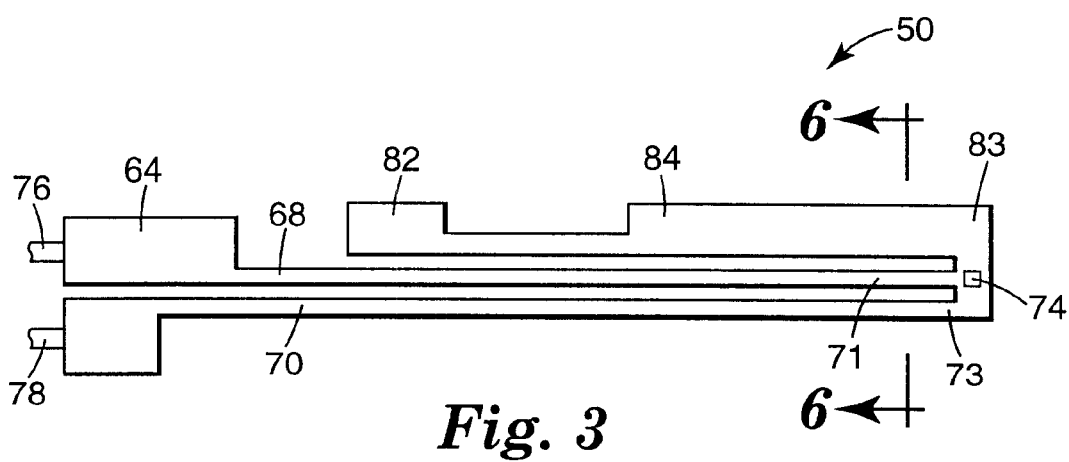
FIG. 3 is a top view of a horizontal and vertical thermal actuator in accordance with the present invention.
Figure 4:
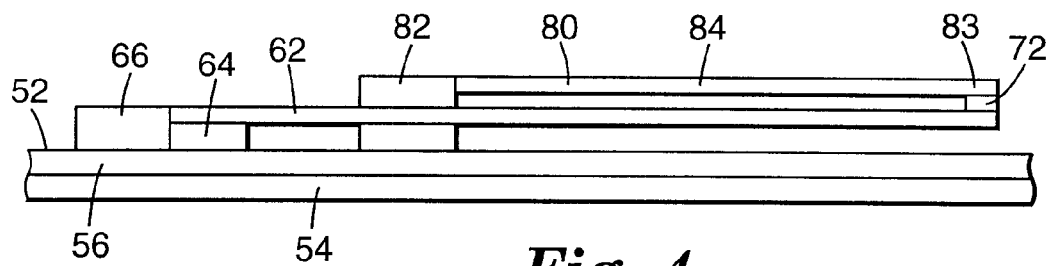
FIG. 4 is a side view of the horizontal and vertical thermal actuator of FIG. 3.
Figure 5:
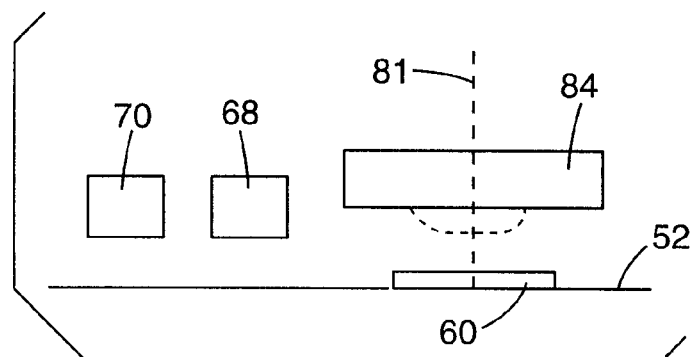
FIG. 5 is a sectional view of the horizontal and vertical thermal actuator of FIG. 3.

FIGS. 3 through 5 illustrate a first embodiment of a horizontal and vertical thermal actuator 50 in accordance with the present invention. As used herein, "horizontal and vertical thermal actuator" refers to a micro-mechanical device capable of repeatably moving between an in-plane position and an out-of-plane position that includes both a horizontal and a vertical component. The horizontal and vertical thermal actuator 50 is disposed in-plane on a surface of a substrate 52 typically comprising a silicon wafer 54 with a layer of silicon nitride 56 deposited thereon. The actuator 50 includes a first layer 60 of polysilicon located on the layer of silicon nitride 56. A second layer of polysilicon 62 is configured to have first and second anchors 64, 66 and a pair of beams 68, 70 arranged in a cantilever fashion from the anchors 64, 66 respectively.

In the embodiment illustrated in FIG. 3, the anchors 64, 66 include electrical contacts 76, 78 formed on the substrate 52 adapted to carry electric current to the beams 68, 70. The traces 76, 78 typically extend to the edge of the substrate 52. Alternatively, a wide variety of electric contact devices and/or packaging methods such as a bail grid array (BGA), land grid array (LGA), plastic leaded chip carrier (PLCC), pin grid array (PGA), edge card, small outline integrated circuit (SOIC), dual in-line package (DIP), quad flat package (QFP), leadless chip carrier (LCC), chip scale package (CSP) can be used to deliver electric current to the beams 68, 70.

The beams 68, 70 are electrically and mechanically coupled at their respective free ends 71, 73 by member 72 to form an electric circuit. The beams 68, 70 are physically separated from the first layer 60 so that the member 72 is located above the substrate 52. In an unactivated configuration illustrated in FIG. 4, the beams 68, 70 are generally parallel to the surface of the substrate 52. As used herein, the "unactivated configuration" refers to a condition in which substantially no current is passed through the circuit formed by the beam 68, the member 72 and the beam 70.

A third layer 80 of polysilicon is configured with an anchor 82 attached to the substrate 52 near the anchor 64, 66. The third layer 80 forms upper beam 84 cantilevered from the anchor 82 with a free end 83 mechanically coupled to the member 72 above the beams 68, 70.

As best illustrated in FIG. 5, the beam 68, 70 are located below and laterally offset from the beam 84 relative to the substrate 52. FIG. 5 illustrates an axis 81 extending perpendicular to the substrate 52 and through the center of the beam 84. The center of mass of the beams 68, 70 is not located along the axis 81.

A via 88 is formed at the member 72 and/or free end 83 to mechanically couple the free end 83 of the upper beam 84 to the member 72. Other structures may be used to mechanically couple the upper beam 84 to the member 72. The upper beam 84 is generally parallel to surface of the substrate 52 in the unactivated configuration.

Figure 6:
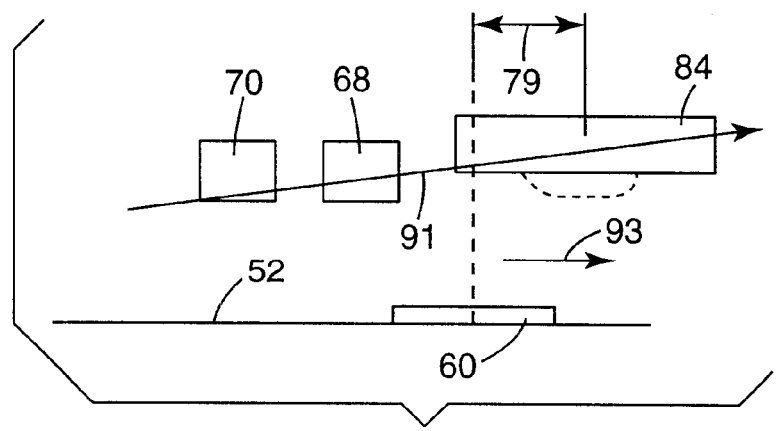
FIG. 6 is a sectional view of the horizontal and vertical thermal actuator of FIG. 3 in the activated position.
Figure 7:
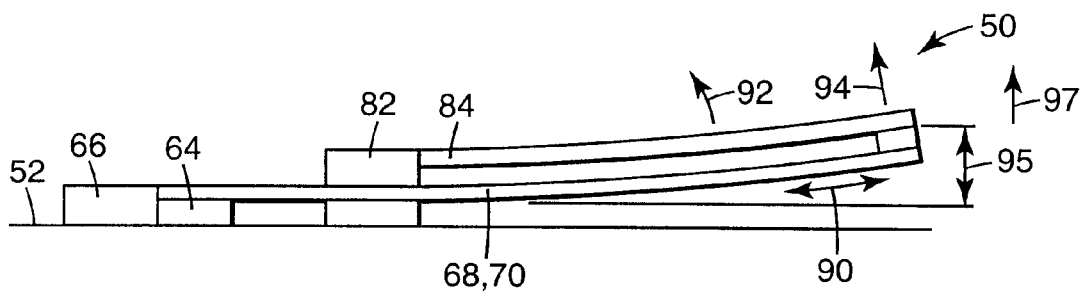
FIG. 7 is a side view of the horizontal and vertical thermal actuator of FIG. 3 in an actuated position.

FIGS. 6 and 7 illustrate the horizontal and vertical thermal actuator 50 of FIGS. 3–5 in an out-of-plane or activated configuration. The "activated configuration" refers to applying electrical current to one or more of the beams. In the illustrated embodiment, the activated configuration comprises applying current to the circuit formed by the beam 68, the member 72, and the beam 70 (see FIG. 3). The beams 68, 70 are the "hot arms" and the beam 84 is the cold arm. As used herein, "hot arm" or "hot arms" refer to beams or members that have a higher current density than the cold arm(s) when a voltage is applied. "Cold arm" or "cold arms" refer to beams or members that have a lower current density than the hot arm(s) when a voltage is applied. In some embodiments, the cold arm(s) has a current density of zero. Consequently, the hot arms have greater thermal expansion than the cold arms.

The electric current heats the hot arms 68, 70 and causes them to increase in length in the direction 90. Since the hot arms 68, 70 are laterally offset and below the cold arm 84, expansion in the direction 90 causes horizontal and vertical displacement of the cold arm 84 (and the member 72) along an axis 91 that passes generally through the center of mass of the arms 68, 70, 84. As used herein, "horizontal and vertical displacement" refers to a displacement with a component parallel to the substrate and a component perpendicular to the substrate.

With regard to horizontal displacement, expansion of the hot arms 68, 70 causes horizontal displacement 93 of the cold arm 84 parallel to the substrate 52 a distance 79, as illustrated in FIG. 6. As used herein, "horizontal displacement" refers to the displacement parallel to the plane of the substrate. The section of FIG. 6 is taken near the member 72 and approximates the total lateral displacement thereof.

With regard to vertical displacement, expansion of the hot arms 68, 70 causes the cold arm 84 to move in an upward arc 92 a distance 95, as illustrated in FIG. 7. Vertical displacement 97 is perpendicular to the plane of the substrate 52.

The combination of horizontal and vertical displacement generates lifting force 94. Due to the height difference between the cold arm 84 and the hot arms 68, 70, a moment is exerted on the cold arm 84 near the anchors 64, 66. The hot arms 68, 70 bend easily, offering little resistance to the motion 92 of the cold arm 84. The cold arm 84, however, is fixed at the anchor 82 and electrically isolated so that the current entirely or substantially passes through the circuit formed by the hot arms 68, 70 and the member 72. In the illustrated embodiment, the displacement 95 can be about 1 micrometers to about 5 micrometers. When the current is terminated, the horizontal and vertical thermal actuator 50 returns to its original, unactivated configuration illustrated in FIG. 4.

In an alternate embodiment, the anchor 82 and the cold arm 84 are electrically coupled to the member 72. At least a portion of the current flowing through the hot arms 68, 70 flows along the cold arm 84 to the anchor 82. It is also possible that all of the current flowing through the hot arms 68, 70 exits the horizontal and vertical thermal actuator 50 through the cold arm 84. The material and/or geometry of the cold arm 84 is adapted to have a lower current density than the hot arms 68, 70, even when the same voltage is applied. In one embodiment, the cold arm 84 is formed from a material with a coefficient of linear thermal expansion less than the coefficient of linear thermal expansion of the hot arms 68, 70. In yet another embodiment, the cold arm 84 is provided with a lower electrical resistivity by having a larger cross sectional area. In another embodiment, a conductive layer is provided on the cold arm 84. Suitable conductive materials include metals such as aluminum, copper, tungsten, gold, or silver, semiconductors, and doped organic conductive polymers such as polyacetylene, polyaniline, polypyrrole, polythiophene, polyEDOT and derivatives or combinations thereof Consequently, the net expansion of the hot arms 68, 70 is greater than the expansion of the cold arm 84.

In another alternate embodiment, all or a portion of the current flowing through the hot arms 68, 70 flows through grounding tab (see FIG. 9) to the substrate 52. The grounding tab maintains electrical contact with a contact pad the substrate 52 as the thermal actuator 50 moves from the unactivated position to the activated position.

Figure 8:
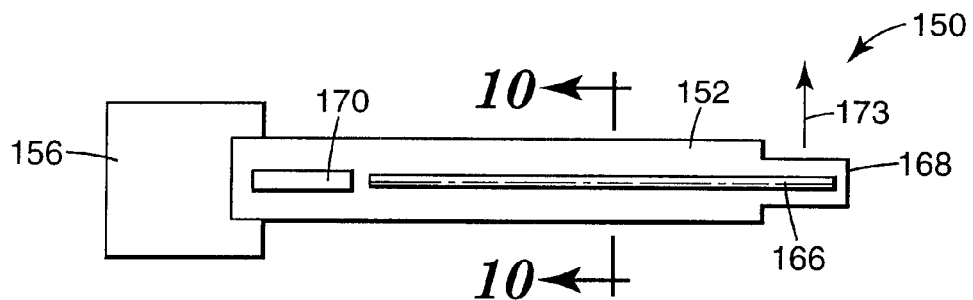
FIG. 8 is a top view of a two-beam horizontal and vertical thermal actuator in accordance with the present invention.
Figure 9:
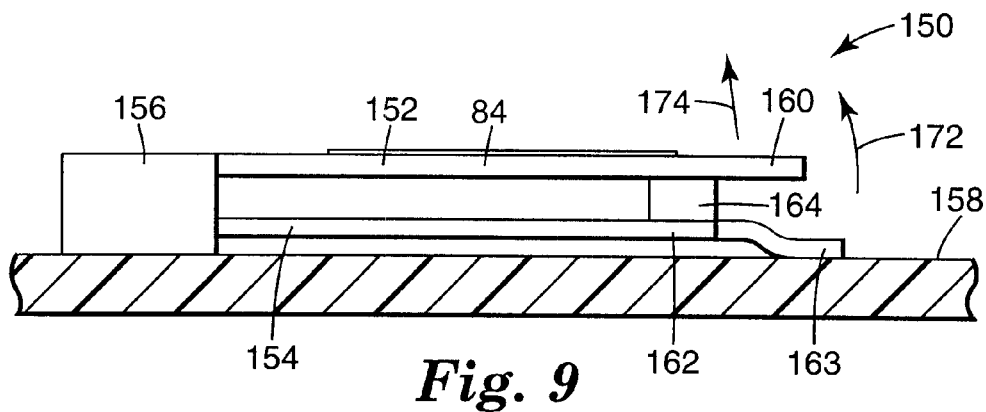
FIG. 9 is a side view of the horizontal and vertical thermal actuator of FIG. 8.
Figure 10:
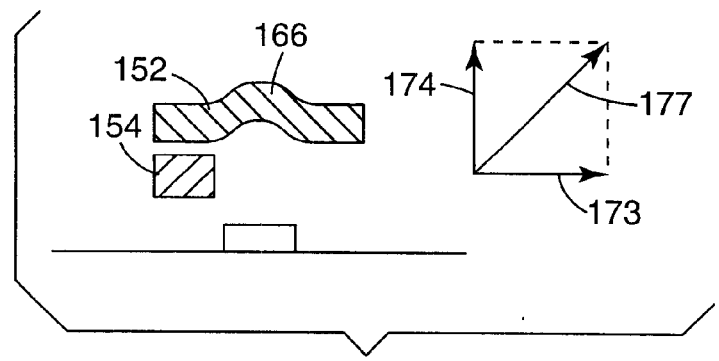
FIG. 10 is a sectional view of the horizontal and vertical thermal actuator of FIG. 8.

FIGS. 8 through 10 illustrate a horizontal and vertical thermal actuator 150 with two beams 152, 154 in accordance with the present invention. The cold arm or beam 152 extends from anchor 156 in a cantilever fashion above and to the side of the hot arm or beam 154 and the substrate 158. The hot arm 154 optionally extends from the anchor 156 or from a separate anchor (see FIG. 11). Free ends 160, 162 of the beams 152, 154, respectively, are mechanically and electrically coupled at member 164. Reinforcing member 166 optionally extends along a portion of the cold arm 152. Flexure 170 is optionally formed in the cold arm 152 near the anchor 156.

When current is applied to the circuit formed by the beams 152, 154, and the member 164, the thermal actuator 150 moves along displacement vector 177 that extends through the center of mass of the beams 152, 154. The displacement vector 177 comprises a vertical component 174 and a horizontal component 173. The magnitude of the respective components 173, 174 can be adjusted by altering the position of the hot arm 154 relative to the cold arm 152. The flexure 170 will also determine, in part, the magnitude of the components 173, 174. In one embodiment, the flexure provides asymmetrical resistance to bending, thereby increasing the magnitude of one of the components 173, 174.

As used herein, "reinforcing member" refers to one or more ridges, bumps, groove or other structural features that increase resistance to bending. The reinforcing members are preferably integral with the cold arm 152. In the illustrated embodiment, the reinforcing member 166 is a curvilinear ridge (see FIG. 10) extending along a portion of the cold arm 152, although it could be rectangular, square, triangular or a variety of other shapes. Additionally, the reinforcing member 166 can be located in the center of the cold arm 152 or along the edges thereof Multiple reinforcing members may also be used.

As used herein, "flexure" refers to a recess, depression, hole, slot, cut-out, location of narrowed, thinned or weakened material, alternate material or other structural features or material change that provides controlled bending in a particular location. As used herein, "controlled bending" refers to bending that occurs primarily at a discrete location, rather than being distributed along the beams of the horizontal and vertical thermal actuator. Alternate materials suitable for use as a flexure include polysilicon, metal or polymeric material. As best illustrated in FIGS. 3 and 5, the flexure 87 is a recess 89. The flexure 170 comprises the weakest section of the cold arm 152, and hence, the location most likely to bend during actuation of the horizontal and vertical thermal actuator 150.

The rigidity of the cold arm 152 relative to the rigidity of the flexure 170 determines to a large extend the magnitude (location and direction) of the controlled bending of the horizontal and vertical thermal actuator 150. In one embodiment, the reinforcing member 166 is used in combination with the flexure 170. In another embodiment, the reinforcing member 166 extends along a portion of the cold arm 152, but no flexure is used. The portion of the cold arm 152 without the reinforcing member 166 is the location of controlled bending. In yet another alternate embodiment, the flexure 170 is formed in the cold arm 152 without the reinforcing member 166 such that the flexure 170 is the location of controlled bending.

In one embodiment, the cold arm 152, the member 164 and the hot arm 154 form a circuit. The material and/or geometry of the cold arm 152 is controlled so that it experiences a lower current density than the hot arm 154 when a voltage is applied to the circuit, as discussed above.

In another embodiment, a grounding tab 163 electrically couples the hot arm 154 to contact pad 165 on the substrate 158. The grounding tab 163 is preferably flexible or a spring member so that its electrical coupling with the substrate 158 is maintained in the activated state (see generally FIG. 9). Consequently, less current (or no current) flows through the cold arm 152, thereby increasing the total displacement of the horizontal and vertical thermal actuator 150.

Figure 11:
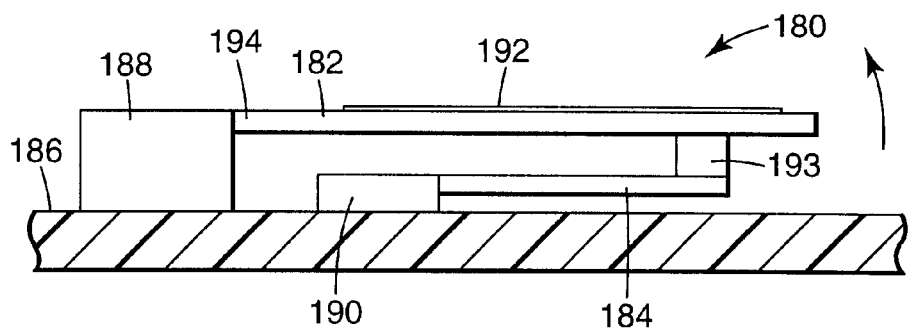
FIG. 11 is a side view of a two-beam horizontal and vertical thermal actuator in accordance with the present invention.

FIG. 11 is a side view of a horizontal and vertical thermal actuator 180 with cold arm or beam 182 located generally above and to the side of the hot arm or beam 184, such as illustrated in FIG. 10. The cold arm 182 is attached to substrate 186 by anchor 188. Reinforcing member 192 is optionally located on the cold arm 182. A flexure 194 is optionally located on the cold arm 182 near the anchor 188.

The hot arm 184 is attached to substrate 186 by anchor 190. In one embodiment, the beams 182, 184 are electrically and mechanically coupled at member 193. By locating the anchor 188 further from the member 193 than the anchor 190, the horizontal and vertical thermal actuator 180 of FIG. 11 is capable of greater displacement in the direction 194, but generates a lower lifting force. In an alternate embodiment, the hot arm 184 can be electrically coupled to the substrate by a grounding tab such as discussed in connection with FIG. 9.

Figure 12:
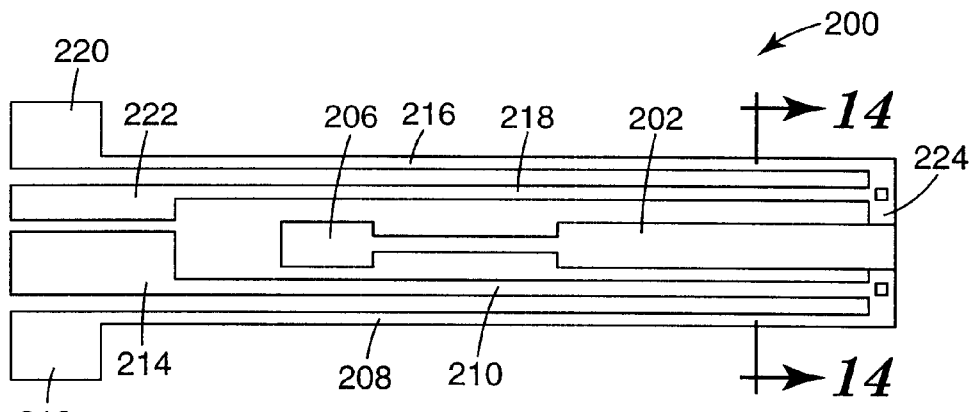
FIG. 12 is a top view of horizontal and vertical thermal actuator with multiple hot arms in accordance with the present invention.
Figure 13:
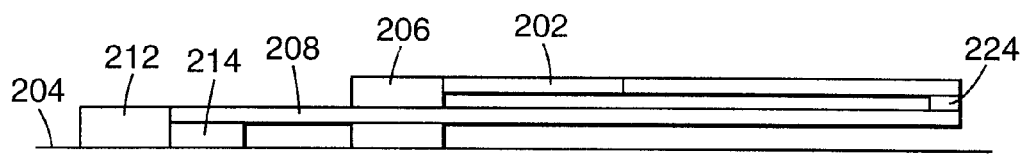
FIG. 13 is a side view of the horizontal and vertical thermal actuator of FIG. 12.
Figure 14:
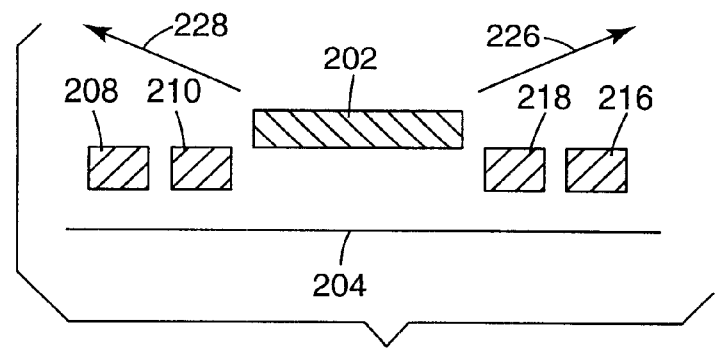
FIG. 14 is an end view of the horizontal and vertical thermal actuator of FIG. 12.

FIGS. 12 through 14 illustrate another embodiment of a horizontal and vertical thermal actuator 200 in accordance with the present invention. Cold arm 202 is cantilevered from anchor 206 above substrate 204. A first pair of hot arms 208, 210 are cantilevered from anchors 212, 214, respectively, along a first side of the cold arm 202. A second pair of hot arms 216, 218 are cantilevered from anchors 220, 222, respectively, above the substrate 204 along a second side of the cold arm 202. Distal ends of the arms 202, 208, 210, 216 and 218 are mechanically coupled by member 224.

As best illustrated in FIG. 14, the hot arms 208, 210 are located below and to the side of (or laterally offset from ) the cold arm 202 relative to the substrate 204. Similarly, the hot arms 216, 218 are located below and to the other side of the cold arm 202. In the illustrated embodiment, the center of mass of the hot arms 208, 210, 216, 218 are centered under the cold arm 202. That is, the plurality of hot arms 208, 210, 216, 218 are laterally offset but symmetrically arranged relative to the cold arm 202.

By selectively applying current to the hot arms 208, 210, 216, 218, the actuator 200 can be made to move out of plane in various directions. In one embodiment, the hot arms 208, 210 form an electric circuit that causes the cold arm 202 to be displaced both horizontally and vertically in the direction 226. In another embodiment, the hot arms 216, 218 form an electric circuit that causes the cold arm 202 to be displaced both horizontally and vertically in the direction 228. Alternatively, electric current is applied to all of the hot arms 208, 210, 216, 218 to move the cold arm 202 vertically off of the substrate 204. The cold arm 202 may also be part of the electric circuit, as discussed above.

Figure 15:
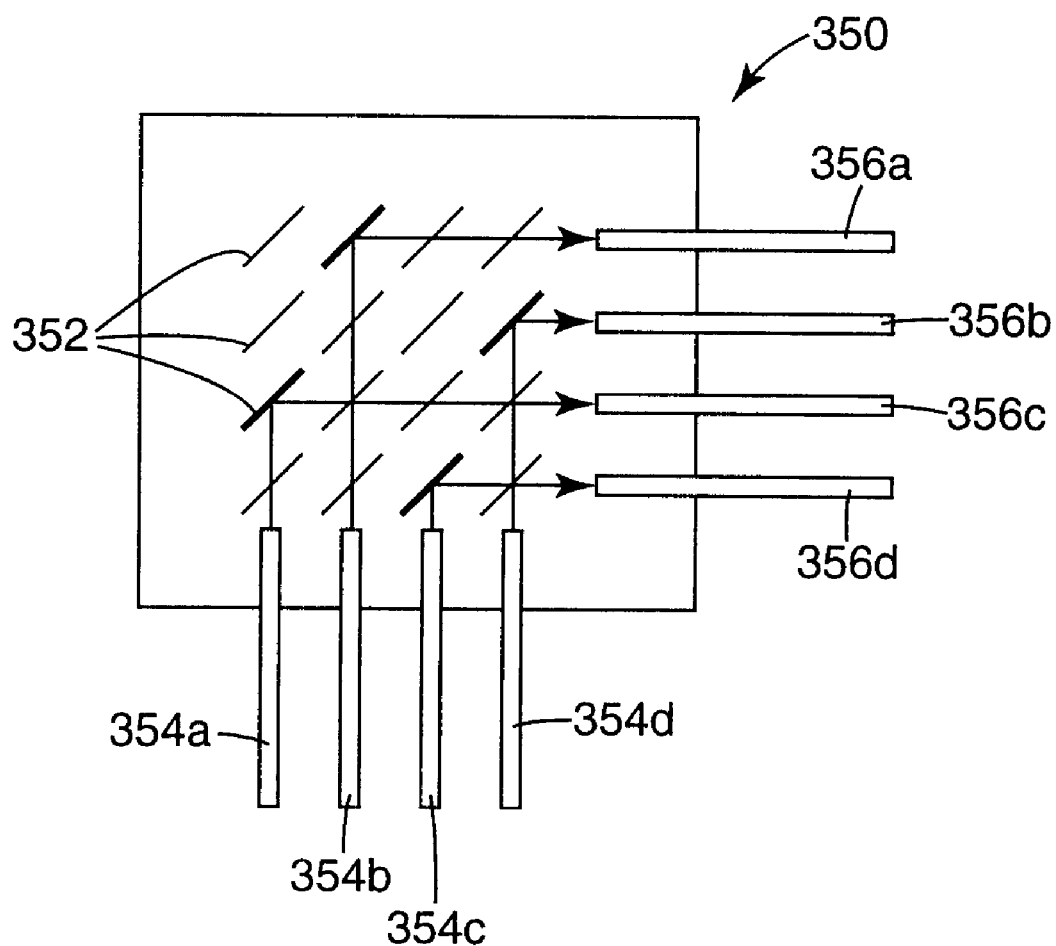
FIG. 15 is a schematic illustration of an optical switch in accordance with the present invention.

FIG. 15 is schematic illustration of an optical switch 350 utilizing a 4×4 array of optical devices 352. As used herein, "optical device" refers to reflectors, lenses, polarizing devices, wave guides, shutters, or occlusion devices. Each of the optical devices 352 is mechanically coupled to one or more horizontal and vertical thermal actuators illustrated herein. In the in-plane position, the optical devices 352 do not extend into the optical path of input optical fibers 354a–354d. In the out-of-plane configuration the optical devices 352 extend into the optical path of the input optical fibers 354a–354d. The array of vertical mirrors 352 are arranged to permit an optical signal from any of the input fibers 354a–354d to be optically coupled with any of the output fibers 356a–356d through selective actuation of the horizontal and vertical thermal actuators. The optical switch 350 illustrated in FIG. 15 is for illustration purposes only. The present horizontal and vertical thermal actuators may be used in any of a variety of optical switch architectures, such as an on/off switch (optical gate), 2×2 switch, one x n switch, or a variety of other architectures. The optical device can be part of an optical communication system.

All of the patents and patent applications disclosed herein, including those set forth in the Background of the Invention, are hereby incorporated by reference. Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention. For example, any of the flexures, reinforcing structures, anchor locations and beam configurations disclosed herein can be combined to produce numerous horizontal and vertical thermal actuators.

What is claimed is:

1. A horizontal and vertical thermal actuator constructed on a surface of a substrate comprising:
   at least one hot arm having a first end anchored to the surface and a free end located above the surface;
   a grounding tab electrically coupling the hot arm to the substrate;
   a cold arm having a first end anchored to the surface and a free end, the cold arm being located above and laterally offset from the hot arm relative to the surface; and
   a member mechanically and electrically coupling the free ends of the hot and cold arms such that the actuator exhibits vertical displacement and horizontal displacement when current is applied to at least the hot arm.

2. The apparatus of claim 1 comprising a flexure formed in the cold arm near the first end thereof adapted to provide controlled bending.

3. The apparatus of claim 2 wherein the flexure comprises at least one of a recess, depression, cut-out, hole, location of narrowed, thinned or weakened material, alternate material or other structural features or material change that decreases resistance to bending in that location.

4. The apparatus of claim 1 wherein the cold arm is electrically isolated from the hot arm.

5. The apparatus of claim 1 comprising a reinforcing member formed in the cold arm.

6. The apparatus of claim 5 wherein the reinforcing member is integrally formed in the cold arm.

7. The apparatus of claim 1 comprising a metal layer extending along the cold arm.

8. The apparatus of claim 1 wherein the at least one hot arm comprises two or more hot arms each having a first end anchored to the surface and free ends located above the surface.

9. The apparatus of claim 1 wherein the at least one hot arm comprises a plurality of hot arms arranged laterally offset and symmetrical with the cold arm.

10. The apparatus of claim 1 comprising a plurality of horizontal and vertical thermal actuators on the substrate.

11. The apparatus of claim 1 comprising at least one optical device mechanically coupled to the horizontal and vertical thermal actuator.

12. The apparatus of claim 11 wherein the optical device comprises one of a reflector, a lens, a polarizer, a wave guide, a shutter, or an occluding structure.

13. The apparatus of claim 11 comprising an optical communication system including at least one optical device.

14. A horizontal and vertical thermal actuator constructed on a surface of a substrate comprising:
    a first beam having a first end anchored to the surface and a free end located above the surface;
    a second beam having a first end anchored to the surface and a free end located above the surface;
    a grounding tab electrically coupling the first and second beams to the substrate;
    a member electrically and mechanically coupling the free end of the first beam to the free end of the second beam;
    a third beam having a first end anchored to the surface and a free end mechanically coupled to the member, the third beam being located above and laterally offset from the first and second beams relative to the surface; and
    first and second electrical contacts electrically coupled to the first ends of the first and second beams, respectively, the actuator exhibiting vertical displacement and horizontal displacement when current is applied to the first and second beams.

15. The apparatus of claim 14 comprising a flexure located on the third beam proximate the first end thereof.

16. The apparatus of claim 15 wherein the flexure comprises at least one recess, depression, cut-out, hole, location of narrowed, thinned or weakened material, alternate material or other structural features or material change that decreases resistance to bending in that location.

17. The apparatus of claim 14 wherein the first and second beams comprise a circuit through which electric current is passed.

18. The apparatus of claim 15 comprising a reinforcing member formed in the third beam.

19. The apparatus of claim 14 comprising a metal layer extending along the third beam.

20. The apparatus of claim 14 wherein at least a portion of any current in the first and second beams passes through the third beam.

21. The apparatus of claim 14 wherein the third beam is generally parallel to the surface in an unactivated configuration.

22. The apparatus of claim 14 comprising a plurality of horizontal and vertical thermal actuators constructed on the substrate.

23. The apparatus of claim 14 comprising at least one optical device mechanically coupled to the horizontal and vertical thermal actuator.

24. The apparatus of claim 23 wherein the optical device comprises one of a reflector, a lens, a polarizer, a wave guide, a shutter, or an occluding structure.

25. The apparatus of claim 23 comprising an optical communication system including at least one optical device.

26. A horizontal and vertical thermal actuator constructed on a surface of a substrate comprising:
    at least one hot arm having a first end anchored to the surface and a free end located above the surface;
    a cold arm having a first end anchored to the surface and a free end, the cold arm being located above and laterally offset from the hot arm relative to the surface wherein the hot arm and the cold arm comprise a circuit through which electric current is passed; and a member mechanically and electrically coupling the free ends of the hot and cold arms such that the actuator exhibits vertical displacement and horizontal displacement when current is applied to at least the hot arm.

27. The apparatus of claim 26 comprising a flexure formed in the cold arm near the first end thereof adapted to provide controlled bending.

28. The apparatus of claim 27 wherein the flexure comprises at least one of a recess, depression, cut-out, hole, location of narrowed, thinned or weakened material, alternate material or other structural features or material change that decreases resistance to bending in that location.

29. The apparatus of claim 26 comprising a reinforcing member formed in the cold arm.

30. The apparatus of claim 29 wherein the reinforcing member is integrally formed in the cold arm.

31. The apparatus of claim 26 comprising a metal layer extending along the cold arm.

32. The apparatus of claim 26 wherein the at least one hot arm comprises two or more hot arms each having a first end anchored to the surface and free ends located above the surface.

33. The apparatus of claim 26 wherein the at least one hot arm comprises a plurality of hot arms arranged laterally offset and symmetrical with the cold arm.

34. The apparatus of claim 26 comprising a plurality of horizontal and vertical thermal actuators on the substrate.

35. The apparatus of claim 26 comprising at least one optical device mechanically coupled to the horizontal and vertical thermal actuator.

36. The apparatus of claim 35 wherein the optical device comprises one of a reflector, a lens, a polarizer, a wave guide, a shutter, or an occluding structure.

37. The apparatus of claim 35 comprising an optical communication system including at least one optical device.

* * * * *